United States Patent [19]

Terada et al.

[11] Patent Number: 4,610,012
[45] Date of Patent: Sep. 2, 1986

[54] SIGNAL TRANSMISSION SYSTEM FEATURING BIDIRECTIONAL TRANSMISSION OF DIFFERENT SIGNAL TYPES OVER A COMMON TRANSMISSION LINE CONNECTING A CENTRAL UNIT AND A PLURALITY OF TERMINAL UNITS

[75] Inventors: Motoharu Terada, Osaka; Kazumasa Murakami, Aichi, both of Japan

[73] Assignee: Matsushita Electric Works, Ltd., Osaka, Japan

[21] Appl. No.: 602,750

[22] Filed: Apr. 23, 1984

[30] Foreign Application Priority Data

Nov. 30, 1983 [JP] Japan ............................... 58-226027

[51] Int. Cl.[4] ............................................. H04J 15/00
[52] U.S. Cl. ................................... 370/110.4; 340/521
[58] Field of Search .................. 370/110.4, 11, 86, 89; 340/521, 522, 531, 534, 536, 537

[56] References Cited

U.S. PATENT DOCUMENTS

| | | | |
|---|---|---|---|
| 3,060,268 | 10/1962 | Pinet | 370/110.4 |
| 3,612,770 | 10/1971 | Zegers | 370/110.4 |
| 3,732,374 | 5/1973 | Rocher et al. | 370/89 |
| 3,870,828 | 3/1975 | Saliga | 370/110.4 |
| 3,943,284 | 3/1976 | Nelson | 370/24 |
| 4,206,449 | 6/1980 | Galvin et al. | 340/534 |
| 4,385,287 | 5/1983 | Eatwell | 340/537 |

Primary Examiner—Douglas W. Olms
Attorney, Agent, or Firm—Stevens, Davis, Miller & Mosher

[57] ABSTRACT

A signal transmission system for transmitting a first signal and a second signal superposed thereupon through a common signal transmission line composed of two wires. A plurality of terminal units are connected through the common signal transmission line to a central unit and are connected in parallel with each other across the two wires of the signal transmission line. At least one of the terminal units transmits the first signal in the form of a level signal; and at least one of the terminal units transmits or receive the second signal in the form of a superposed signal on the level signal. The central unit transmits and receives the superposed signal as well as receives the level signal for receiving data or information respectively from the above terminal units. Accordingly, both the first and second signals of different types and therefore carrying different information can be transmitted between the central unit and the respective terminal units through the common signal transmission line.

12 Claims, 18 Drawing Figures

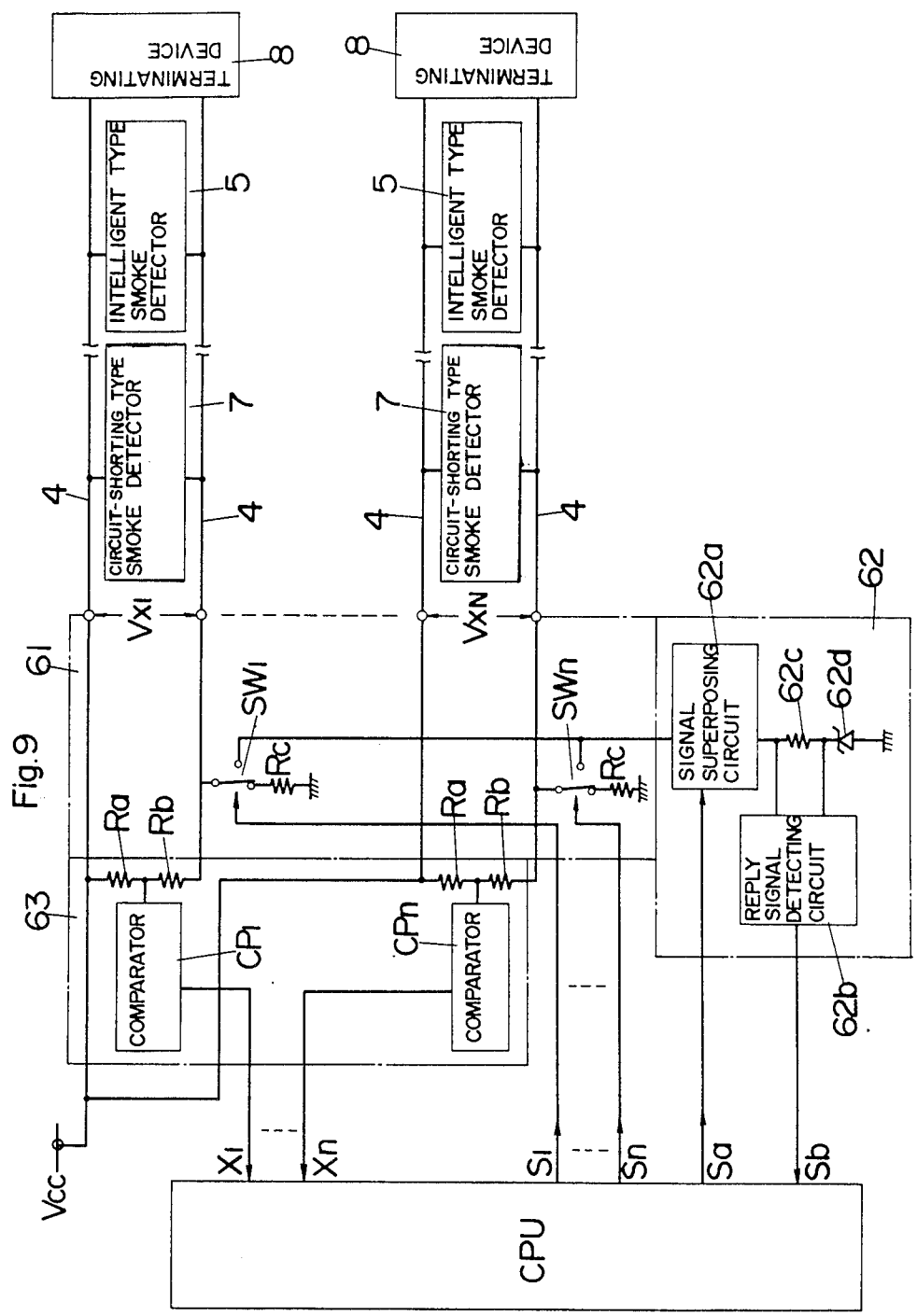

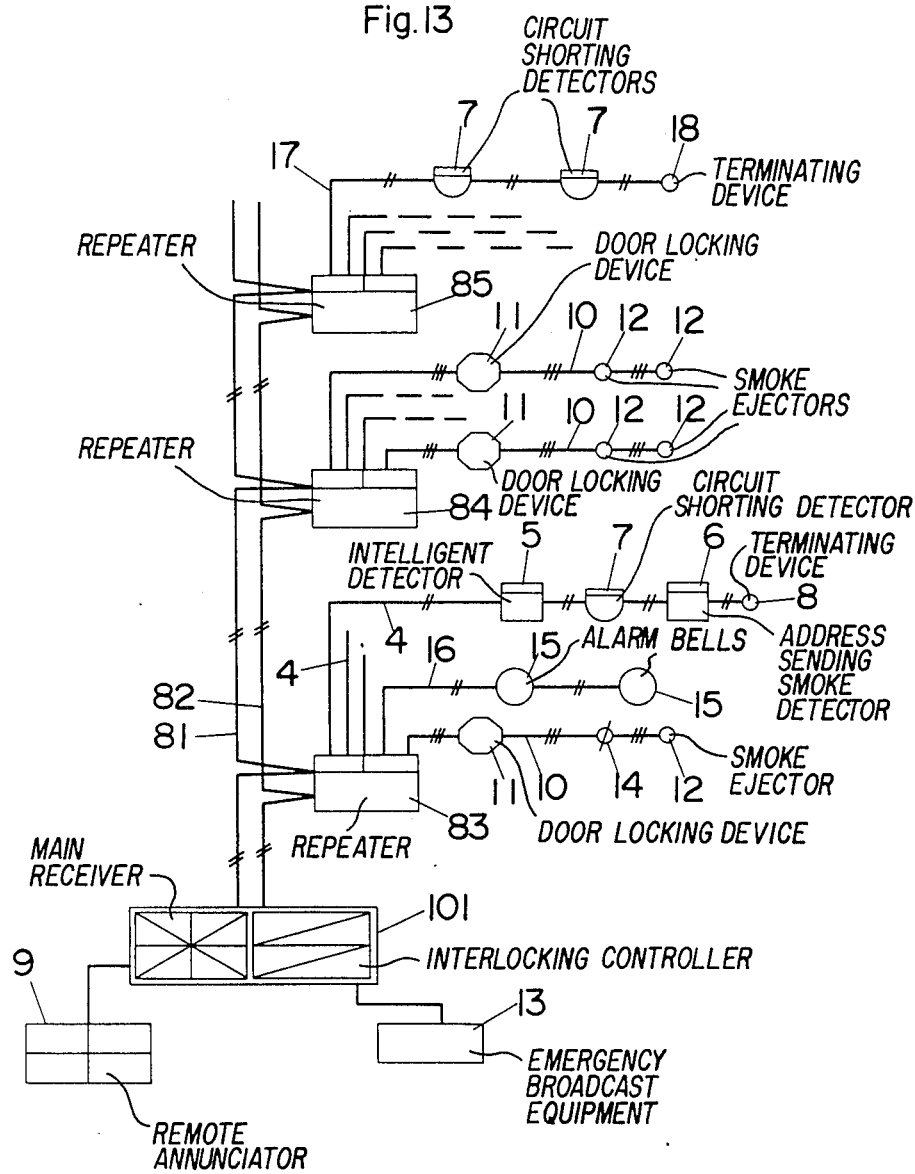

SIGNAL TRANSMISSION SYSTEM FEATURING BIDIRECTIONAL TRANSMISSION OF DIFFERENT SIGNAL TYPES OVER A COMMON TRANSMISSION LINE CONNECTING A CENTRAL UNIT AND A PLURALITY OF TERMINAL UNITS

BACKGROUND OF THE DISCLOSURE

1. Fields of the Invention

This invention relates to a signal transmission system, more particularly to a signal transmission system with signal transmission lines through each of which both a level signal and a superposed signal thereupon are transmitted between a central unit and each of a plurality of terminal units.

2. Description of the Prior Art

Conventional systems for transmitting signals between a plurality of terminal units and a central unit can be broadly classified into two types. One is a current level signal transmission system as has been employed in a conventional fire alarm system; the other is a time division multiplex system as has been employed in a known remote supervision and control system.

In the former type of signal transmission system, a plurality of fire detectors such as smoke detectors or heat detectors are connected to a fire alarm receiver through a common signal transmission line of two wires and connected in parallel with each other across the wires of said signal transmission line. When any one of the fire detectors detects the outbreak of a fire, it causes the signal transmission line to become shorted. The resulting increase in the line current is detected by the fire alarm receiver, where it is processed to produce an alarm indicative of fire presence, such as by issuing a warning sound. However, in such a conventional fire alarm system, it is impossible to detect the fire location, as the fire detector can only send a current level signal and is unable to send a signal showing the location of the fire detector.

The latter type of a signal transmission system, as is often called a TDM (Time Division Multiplex) system, has been widely employed in remote supervision and control systems. In this system, as disclosed in U.S. Pat. No. 4,139,737, a plurality of terminal units are connected to a central unit through a common signal transmission line of two wires and connected in parallel with each other across the wires of a signal transmission line. The central unit transmits address signals and control signals sequentially to respective ones of the terminal units. Each of the terminal units receives a corresponding address signal and a control signal transmitted from the central unit so as to be thereby controlled and transmits to the central unit a reply signal in accordance with the control signal. The address, control and reply signals are arranged in a series time band. In this system, each terminal unit is composed of a so-called intelligent type transmission device including a processor (CPU) to send and receive the transmission signal, however, such processor (CPU) is, as is well known, sometimes frail against high temperature caused by a fire. Accordingly, if such a signal transmission system is employed in a fire alarm system, the reliability of signal transmission will be reduced, as compared with the conventional fire alarm system. Therefore, it is most desirable to employ both types of signal transmission systems in combination.

SUMMARY OF THE INVENTION

The above defects have been eliminated by the present invention wherein a plurality of terminal units are connected to a central unit through a common signal transmission line and connected in parallel with each other between two wires of the signal transmission line. Included in the terminal units are a first terminal unit for transmitting a first signal in the form of a level signal, and a second terminal unit for transmitting as well as receiving a second signal superposed on the level signal. The central unit is for transmitting and receiving the superposed signal as well as receiving the level signal. Accordingly, in the present invention, both the first and second signals of different types can be transmitted between the central unit and the respective terminal units by way of the common transmission line. And, even if any one of the second terminal units accidentally becomes out of order, for example, due to heat damage of a CPU normally incorporated in the second terminal unit for communication with the central unit, the first terminal unit can still send a signal successfully in the form of a level signal through the same signal transmission line.

The use of a time division multiplexing for sending a transmission signal is another feature of the present invention. This enables a plurality of signal transmission lines to be connected to a single central unit provided with a signal transmission circuit.

Said first and second signals are arranged to be transmitted between the central unit and the respective terminal units during the respective time bands, that is, a level signal transmission time band and a superposed signal transmission time band which are discrete with each other in time sequence, by which the level signal can be supervised by the central unit without being interfered by the superposed signal.

In a preferred embodiment, a line voltage of the signal transmission line is reduced by the control of the central unit during the superposed signal transmission time band, thereby the current consumption can be saved during this time band, and in addition, the terminal units are capable of distinguishing between the level signal transmission time band and the superposed signal transmission time band.

A further feature of the present invention resides in the introduction of a circuit-shorting type terminal unit that is capable of shorting the signal transmission line through relatively low impedance when it detects an abnormal state such as fire presence and of increasing its impedance to reduce the consumption of the line current shortly after the detection of the increase in the line current by the central unit.

The invention also is provided with a terminating device which terminates each of the signal transmission lines for decreasing its impedance during a line examining time band, thereby the central unit is empowered to examine whether the transmission line is interrupted or not simply by measuring the line current during the line examining time band. A comparator used for detecting the line current increase during the line current examining time band is also used for supervising the current level signal on the signal transmission line during the level signal transmission time band.

In another embodiment of the present invention, there are introduced in the system a plurality of repeater devices to at least one of which are connected said terminal units through a branch line and which are connected to a master receiver through a main line. Carried on the branch line is the level signal and/or said superposed signal for sending to the corresponding repeater the information obtained at the respective terminal units, while only one type of the transmission signal is transmitted on the main line between the repeater and the master receiver for the communication therebetween, whereby the serious attenuation of the level signal which would be the cause of malfunction can be prevented even when the terminal units are located at longer distances from the master receiver, retaining a reliable signal transmission for a long distance communication.

It is, therefore, a primary object of the present invention to provide a signal transmission system that is capable of transmitting first and second signals of different types through a common signal transmission line.

Another object of the present invention is to provide a signal transmission system that is capable of dealing with a plurality of signal transmission lines under the control of a single central unit.

Still another object of the present invention is to provide a signal transmission system that is capable of supervising the level signal without being interfered by the superposed signal.

An additional object of the present invention is to provide a signal transmission system that is capable of reducing the current consumption in the signal transmission line.

A further object of the present invention is to provide a signal transmission system that is capable of examining the line interruption.

Still a further object of the present invention is to provide a signal transmission system that is capable of transmitting a signal with high reliability.

Other objects and advantages of the present invention will be readily understood from the detailed description thereon taken with the accompanying drawings.

BRIEF DESCRIPTION OF THE DRAWINGS

In the drawings,

FIG. 9 is a schematic diagram in somewhat concrete representation of the part of the above receiver with the above signal transmission lines connected thereto;

FIG. 13 is a block diagram of a fire alarm system in accordance with the second embodiment of the present invention;

DETAILED DESCRIPTION OF THE PREFERRED EMBODIMENTS

Figure 1:
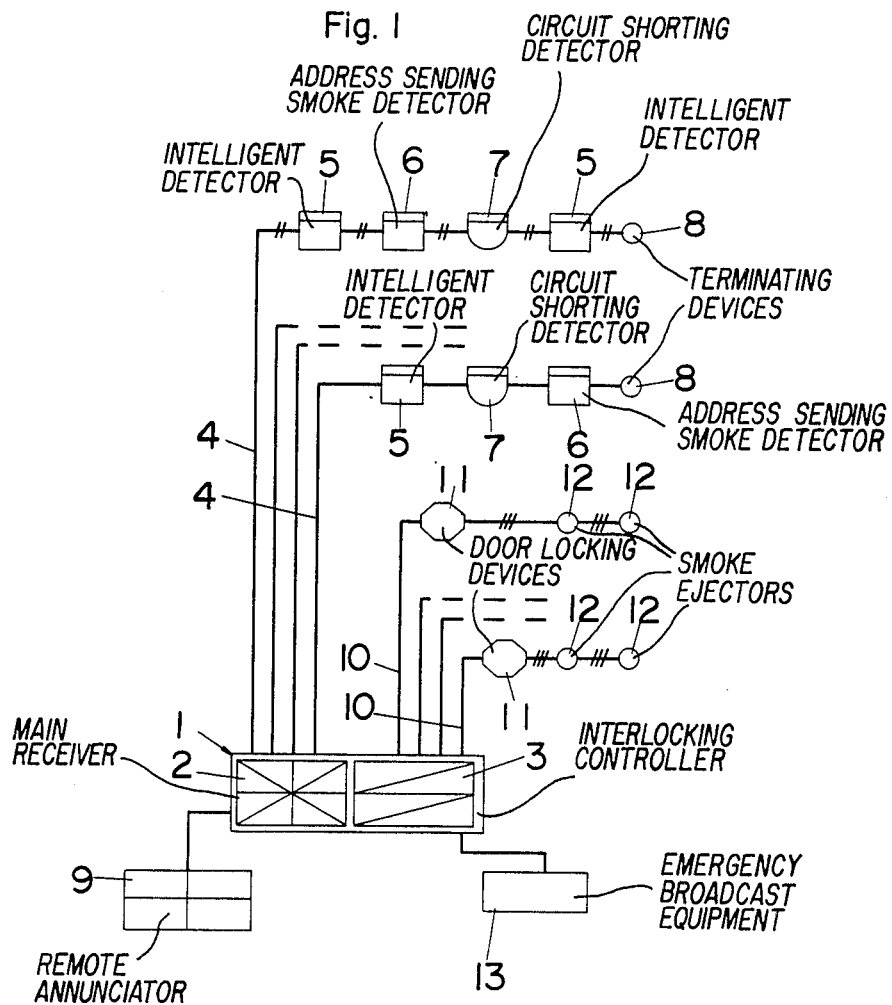
FIG. 1 is a block diagram of a fire alarm system in accordance with one preferred embodiment of the present invention.

The present invention shall now be explained with reference to a preferred embodiment as shown in FIGS. 1 through 12. These figures show a fire alarm system in accordance with one embodiment of the present invention. This fire alarm system is, as shown in FIG. 1, composed mainly of a composite type receiver 1, fire detectors connected thereto through signal transmission lines 4, and fire-proof or smoke-proof devices connected thereto through control lines 10. Each signal transmission line 4 is composed of two wires; and each control line 10 is composed of three wires.

The composite type receiver 1 is composed of a main receiver 2 and an interlocking controller 3. The main receiver 2 is connected to the signal transmission lines 4 for supervising the fire detectors. The interlocking controller 3 is connected to the control lines 10 for controlling the fire-proof or smoke-proof devices. In this embodiment, the fire detectors include intelligent type smoke detectors 5, address-sending type smoke detectors 6, and circuit-shorting type fire detectors 7. Each signal transmission line 4 is provided at its terminal end with a terminating device 8. A remote annunciator 9 is connected to the main receiver 2. The interlocking controller 3 is interlocked with the main receiver 2 and controls fire-proof door locking devices 11 and smoke ejectors 12 both connected to the control lines 10. An emergency broadcasting equipment 13 is connected to the interlocking controller 3. These components will be explained more closely afterwards.

Figure 2:
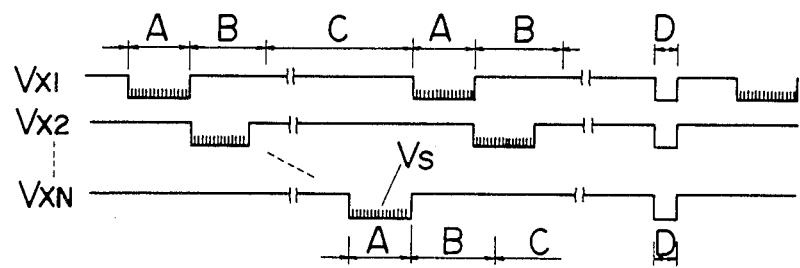
FIG. 2 is a wave form chart showing the voltage wave form on signal transmission lines employed in the above fire alarm system.
Figure 3:
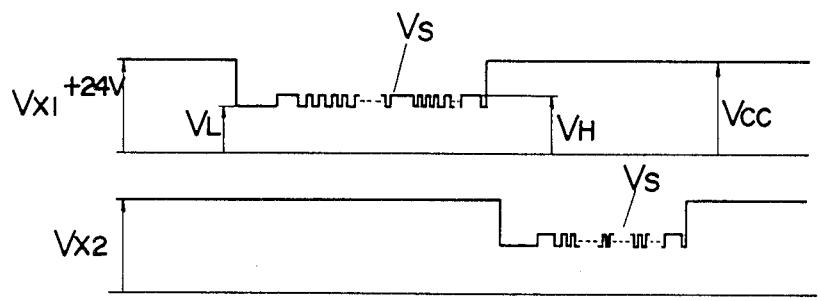
FIG. 3 is an enlarged wave form chart showing a part of the above wave form chart.

FIG. 2 shows the waveforms of line voltages $Vx_1$ through $Vx_N$ on the respective signal transmission lines 4. FIG. 3 shows enlarged wave forms of the line voltages $Vx_1$ and $Vx_2$. As shown in the figure, the line voltages $Vx_1$ through $Vx_N$ are divided into a signal transmission time band A, a line examining time band B, and a supervisory time band C. In the signal transmission time band A, a main receiver 2 sends a transmission signal Vs on each signal transmission line 4. In this time band A, the line voltage is lower than those in the other time bands B and C. The normal voltage of the signal transmission line 4 is 24V, while the line voltage is reduced to 12V at its peak during the transmission time band A. In the line examining time band B, the impedance of the terminating device 8 decreases in order that the main receiver 2 can examine whether or not the signal transmission line 4 is interrupted by measuring the line current increase during this time band B. In the supervisory time band C, the main receiver 2 supervises the line current of each signal transmission line 4 and receives current level signals transmitted from the circuit-shorting type fire detectors 7. During the supervisory time band C, no superposed signal is transmitted on the signal transmission line 4, allowing the main receiver 2 to only receive the current level signal without any interference by the superposed signal.

Figure 4:
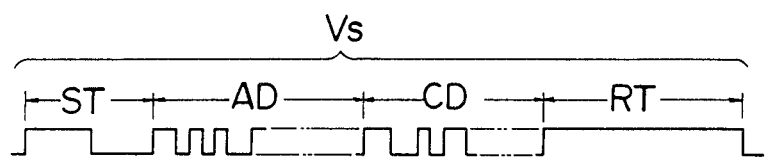
FIG. 4 is a further enlarged wave form chart showing one sequence of a transmission signal on the above signal transmission line.

The transmission signal Vs in the transmission time band A is, as shown in FIG. 4, composed of a start signal ST, an address signal AD, a control signal CD, and a long duration pulse signal RT. The start signal ST shows the starting timing of the transmission signal Vs. The address signal AD shows the specific address assigned to each intelligent type smoke detector 5 and serves to select one detector among the intelligent type smoke detectors 5. The control signal CD includes control information from the main receiver 2 to the intelligent type smoke detector 5. Such control information includes, for example, zero standard level monitoring instruction, as will be discussed later. The long duration pulse signal RT indicates the time band during which the intelligent type smoke detector 5 selected by the address signal AD transmits a reply signal RS in the form of a current pulse signal. The start signal ST, the address signal AD, the control signal CD, and the long duration pulse signal RT are arranged in series. These pulse signals are sent in the form of voltage pulse signals. In the address signal AD and the control signal CD, the long pulse represents a logic value "1" and the short pulse represents a logic value "0".

The intelligent type smoke detector 5 has its own specific address, and when it finds the address information included in the address signal AD to be coincident with its specific address, it reads the control signal CD following the address signal AD, and then transmits a reply signal RS in the form of a current pulse signal during the long duration pulse signal RT. The address-sending type smoke detector 6 is also assigned a specific address, and transmits address information in the form of a current pulse signal upon detecting a fire or smoke.

The circuit-shorting type fire detector 7 transmits a fire detection signal in the form of a current level signal when it detects a fire. The circuit-shorting type fire detector 7 includes a switching element and a current-limiting resistor. Upon detection of a fire, the circuit-shorting type fire detector 7 turns on the switching element so as to make the signal transmission line shorting through the current-limiting resistor. Further concrete constructions of the detectors 5, 6 and 7 are explained in the followings.

Figure 5:
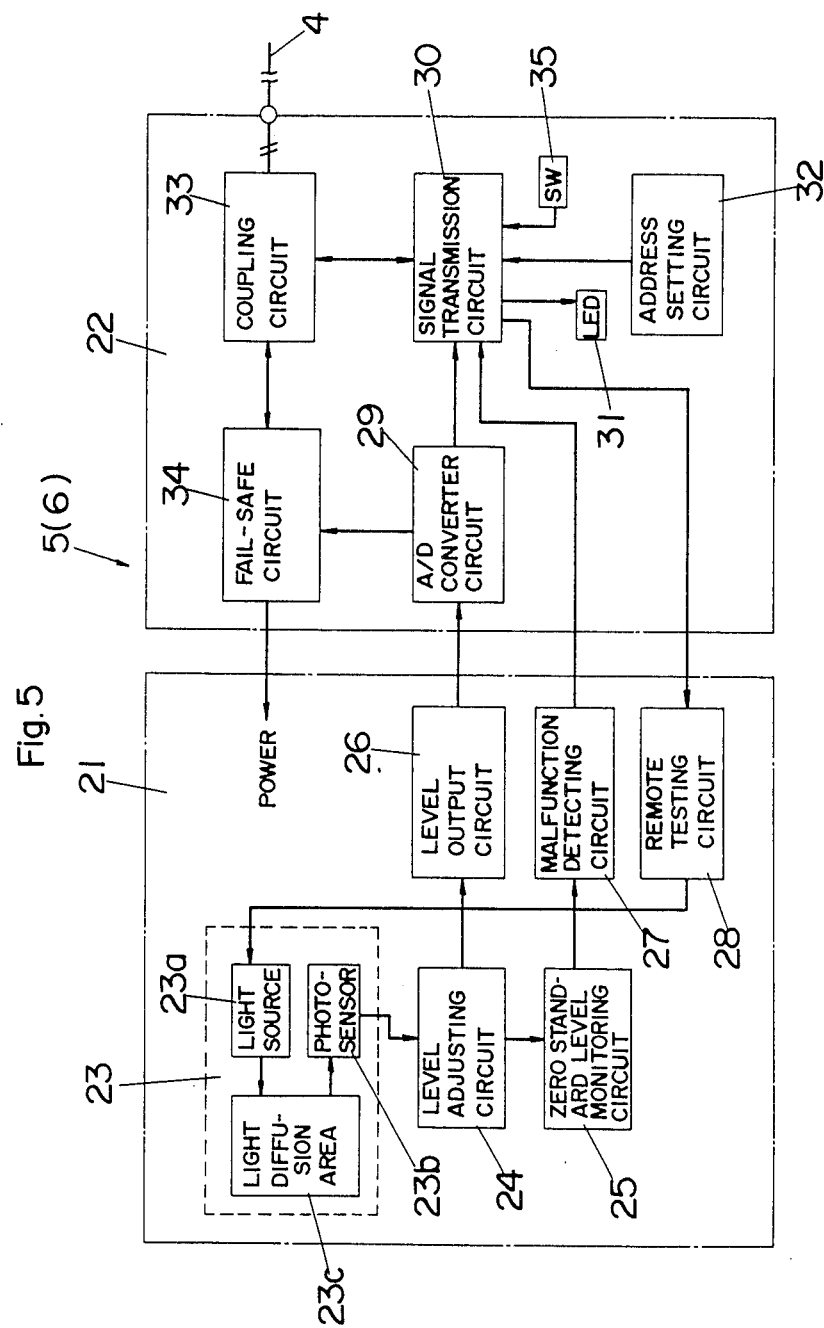
FIG. 5 is a schematic block diagram illustrating the function of an intelligent type smoke detector employed in the above fire alarm system.

FIG. 5 shows a block diagram of the intelligent type smoke detector 5. The intelligent type smoke detector 5 is divided both functionally and mechanically into a smoke detecting unit 21 and a signal processing unit 22. The smoke detecting unit 21 includes a light diffusion type smoke detecting head 23, a level adjusting circuit 24, a zero standard level monitoring circuit 25, a level output circuit 26, a malfunction detecting circuit 27, and a remote testing circuit 28. The smoke detecting head 23 is composed of a light source 23a which emits a pulse modulated light, a photosensor 23b which detects the pulse modulated light, and a light diffusion area 23c where the pulse modulated light is diffused by smoke, if any. The photosensor 23b detects little light when no substantial smoke exists. When smoke enters the light diffusion area 23c, the light emitted from the light source 23a is diffused by the smoke particles so that the photosensor 23b can detect the amount of the resulting diffused light as representing the smoke density. The level adjusting circuit 24 is for automatically adjusting the output level of the photosensor 23b.

Figure 11:
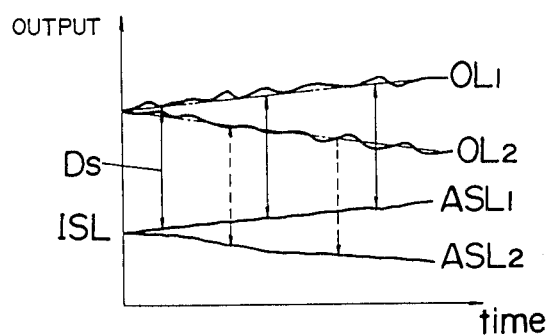
FIG. 11 is an explanatory diagram illustrating the operation of a level adjusting circuit employed in the above intelligent type smoke detector.

FIG. 11 is an explanatory diagram illustrating the operation of the level adjusting circuit 24. The level adjusting circuit 24 compensates a drift of a zero standard level which is the output level of the photosensor 23b when no substantial smoke exists. The drift of the zero standard level can be caused by, for example, stains of the light diffusion area 23c, or the deterioration of the light source 23a and/or the photosensor 23b. The initial zero standard level of the fresh smoke detector is indicated at ISL of FIG. 11. However, as time elapses, the zero standard level drifts up as shown by the curve $ASL_1$ in FIG. 11, or drifts down as shown by the curve $ASL_2$ in FIG. 11. The curves $OL_1$ and $OL_2$ show respectively the outputs of the photosensor 43b indicative of the existence of considerable smoke. The symbol Ds in the figure shows the true smoke density detected.

Figure 12:
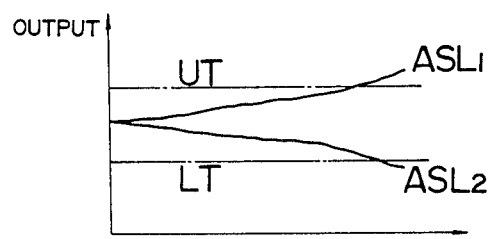
FIG. 12 is an explanatory diagram illustrating the operation of a zero standard level monitoring circuit employed in the above intelligent type smoke detector.

The zero standard level monitoring circuit 25 detects the drifting amount of the zero standard level and judges whether the drifting amount is within a normally expected allowable range. FIG. 12 shows an explanatory diagram to help explain the operation of the zero standard level monitoring circuit 25. When the zero standard level becomes higher than an upper threshold level UT as shown by the curve $ASL_1$, or becomes lower than a lower threshold level LT as shown by the curve $ASL_2$, the zero standard level monitoring circuit 25 detects that the drifting amount of the zero standard level goes beyond said allowable range. At this occurrence, the output of the malfunction detecting circuit 27 becomes from "L" level to "H" level. The remote testing circuit 28 is capable of increasing the light intensity of the light source 23a in several steps in accordance with the control signal CD received from the main receiver 2. The level output circuit 26 is a kind of buffer amplifier to decrease the output impedance of the output level signal.

The signal processing unit 22 includes an analog-digital converter circuit 29, a signal transmission circuit 30, an indicator 31, an address setting circuit 32, a coupling circuit 33, a fail-safe circuit 34, and a selector switch 35. The Analog-digital converter circuit 29 converts the output signal of the level output circuit 26 into a digital signal indicative of the detected smoke density. The signal transmission circuit 30 receives the address signal AD and the control signal CD through the signal transmission line 4 and transmits the reply signal RS in the form of a current pulse signal in accordance with the control signal. The indicator 31 is composed of a light emitting diode (LED). The address setting circuit 32 assigns a specific address to the intelligent type smoke detector 5. The coupling circuit 33 is connected to the signal transmission line 4. The transmission signal Vs on the signal transmission line 4 is extracted in the coupling circuit 33 and is sent to the signal transmission circuit 30. The reply signal from the signal transmission circuit 30 is superposed on the signal transmission line 4 in the coupling circuit 33. When high density smoke is detected for a predetermined time, the fail-safe circuit 34 connects a low impedance to the signal transmission line 4 and increases the line current level. Accordingly, the high density smoke detecting signal never fails to reach the main receiver 2, even if the signal transmission circuit 32 happens to be out of order. The operating power of the intelligent type smoke detector 5 is derived from the signal transmission line 4.

The address-sending type smoke detector 6 has just the same construction as the intelligent type smoke detector 5. The intelligent type smoke detector 5 is provided with the selector switch 35. By the changeover of the selector switch 35, the circuit of the intelligent type smoke detector 5 functions as a circuit of the address-sending type smoke detector 6. Namely, in this case, the signal transmission circuit 30 receives no transmission signal Vs on the signal transmission line 4, but transmits its specific address that has been set at the address setting circuit 32 in the form of a current pulse signal, when the smoke detector section detects that the smoke density is higher than a predetermined level for over a predetermined time. The function of the fail-safe circuit 34 remains unchanged by the changeover of the selector switch 35. So, the address-sending type smoke detector 6 increases the line current level and transmits its specific address in the form of a current pulse signal that is superposed on the current level signal when it detects high density smoke.

Figure 6:
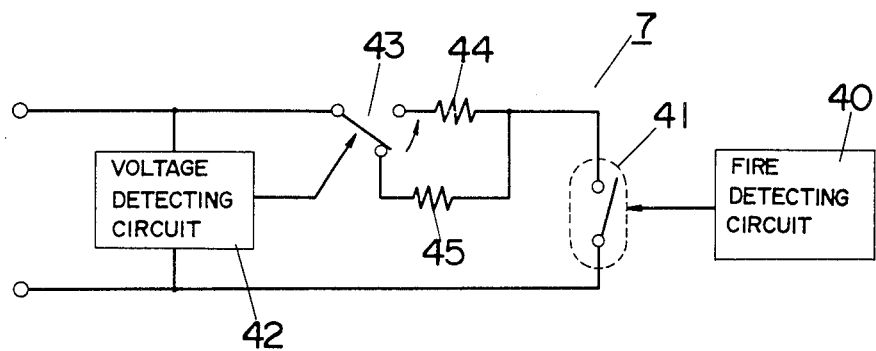
FIG. 6 is a somewhat circuit diagram of a circuit-shorting type fire detector employed in the above fire alarm system.

FIG. 6 shows a schematic illustration of the circuit of the circuit-shorting type fire detector 7. The switching element 41 is composed of a self-hold type switching element such as a thyristor. The switching element 41 is controlled by an output of a fire detecting circuit 40. The fire detecting circuit 40 detects whether an abnormal state such as high temperature or high density smoke is existent or not. When such abnormal state is detected, the switching element 41 is turned on by the output of the fire detecting circuit 40. As shown in FIG. 6, the circuit-shorting type fire detector 7 includes a voltage detecting circuit 42. A selector switching element 43 is controlled by the output of the voltage detecting circuit 42. Current-limiting resistors 44 and 45 are selectively connected in series to the switching element 41 by the changeover of the selector switching element 43. The operating power of the circuit-shorting type fire detector 7 is also derived from the signal transmission line 4.

Figure 7:
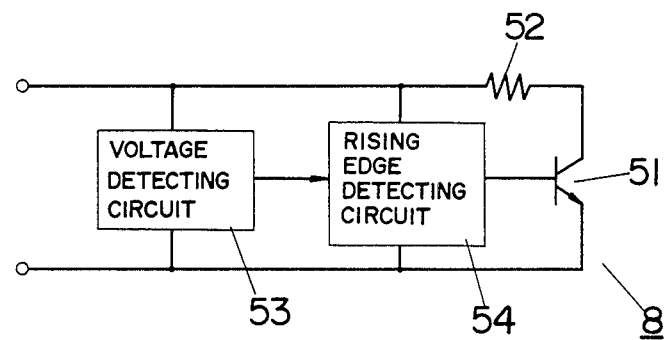
FIG. 7 is a somewhat circuit diagram showing a circuit of a terminating device employed in the above fire alarm system.

FIG. 7 shows a schematic illustration of the circuitry of the terminating device 8. As shown in the figure, the terminating device 8 includes a switching element 51, a current-limiting resistor 52, a voltage detecting circuit 53, and a rising edge detecting circuit 54. The switching element 51 is closed for a predetermined time after the rising edge detecting circuit 54 detects the line voltage rising. The time band when the switching element 51 is closed is equal in duration to said line examining time band B. In this time band, the current-limiting resistor 52 is connected to the terminal ends of the signal transmission line 4. The resistance of the current-limiting resistor 52 is low enough for the main receiver 2 to ascertain the line current increase and examine whether the signal transmission line 4 is interrupted somewhere or not.

Figure 8:
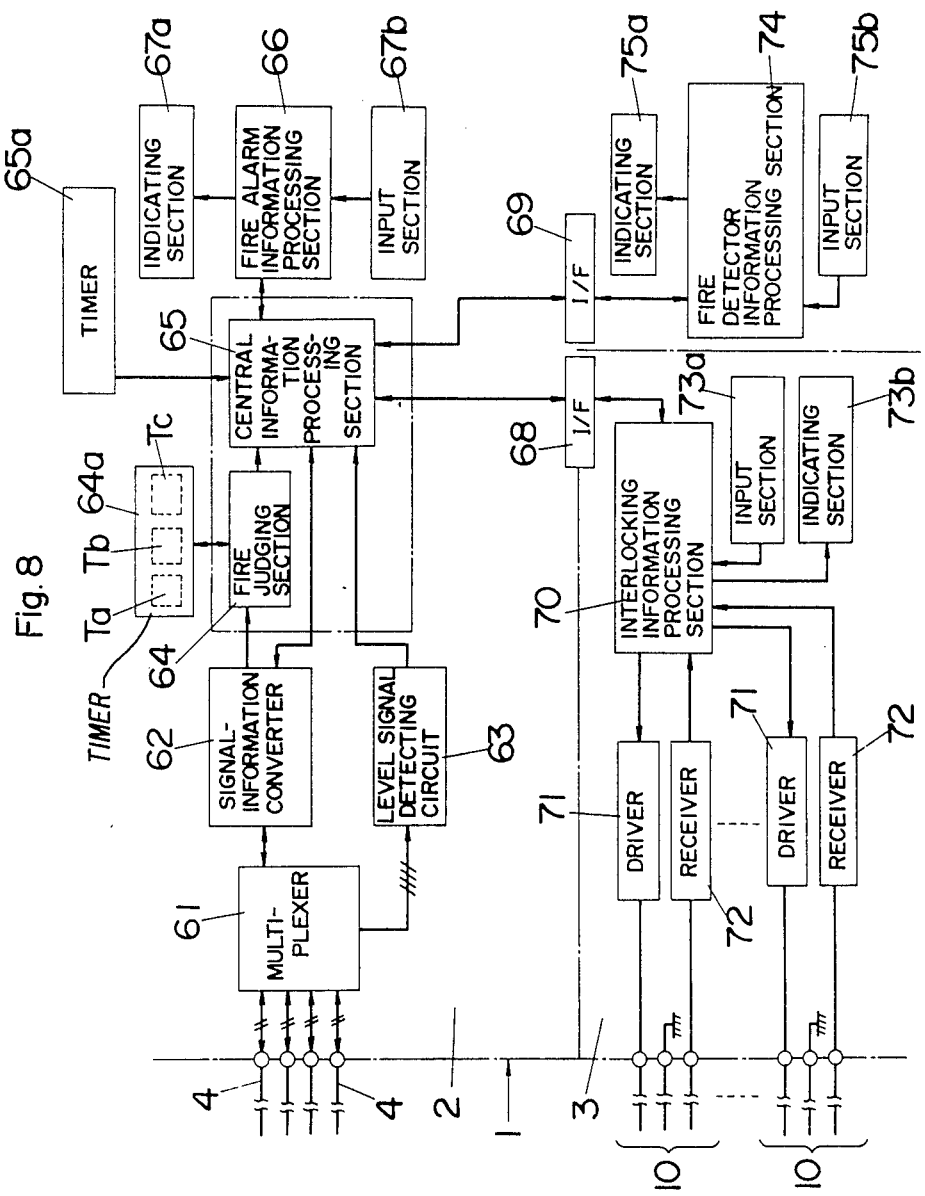
FIG. 8 is a schematic block diagram showing the function of a composite type receiver employed in the above fire alarm system.

FIG. 8 shows a block diagram of the composite type receiver 1. In the figure, a multiplexer 61 is connected to the respective signal transmission lines 4. The multiplexer 61 connects cyclically each one of the signal transmission lines 4 to a signal information converter 62. The signal information converter 62 transmits said transmission signal Vs in the form of a voltage pulse signal, and receives said reply signal RS in the form of a current pulse signal. The current level signals on the signal transmission lines 4 are supervised by a level signal detecting means 63. The output of the signal information converter 62 is analyzed by the fire judging section 64. A timer unit 64a is connected to the fire judging section 64. The timer unit 64a is used to count the time lapse after the detected smoke density exceeds predetermined levels. A central information processing section 65 responds to the determination of fire presence at said fire judging section 64 for providing a corresponding output to a fire alarm information processing section 66, which then produces an alarm signal to an indicating section 67a. Upon receiving the alarm signal, the indicating section 67a will provides a warning indication of fire presence, such as by issuing a sound. The central information processing section 65 is responsible for producing the transmission signals Vs to be transmitted to the respective intelligent type smoke detectors 5 through said signal information converter 62.

An interface 68 is connected between said processing section 66 and an interlocking information processing section 70 in said interlocking controller 3. The interlocking controller 3 includes the interlocking information processing section 70, drivers 71, receivers 72, an indicating section 73a, and an input section 73b. The interlocking information processing section 70 generates a control signal transmitted by way of said drivers 71 for controlling the fire-proof and smoke-proof devices under the control of the central information processing section 65. The fire-proof and smoke-proof devices can be also manually controlled by the operation in the input section 73b. When the fire-proof and smoke-proof devices operate, they send back the individual supervisory signals through the corresponding receivers 72 to said processing section 70, which then provides the indicating section 73a with the information representative of the operation of such devices. As is formerly mentioned, the interlocking controller 3 is connected to the control lines 10. Each control line 10 is composed of a control wire, a supervisory wire and a common wire. The control wire is connected to the driver 71 and used for sending a control signal to fire-proof and smoke-proof devices such as the smoke-proof door locking devices 11 and the smoke ejectors 12. The supervisory wire is connected to the receiver 72 and used for supervising the operation of said fire-proof and smoke-proof devices. By the way, in order to save the number of the control lines 10, it might be preferable to employ a time division multiplex system wherein a plurality of fire-proof or smoke-proof devices are connected to the interlocking controller 3 through a single signal transmission line.

An interface 69 is connected to a fire detector information processing section 74. The fire detector information processing section 74 has an indicating section 75a and an input section 75b. The indicating section 75a is used to indicate various information concerning the individual detectors. The input section 75b is used for providing each fire detector with requisite information.

When the intelligent type smoke detector 5 requires a remote-testing, an instruction to operate the remote-testing circuit 48 is input at the input section 75b by an operator. The instruction is then converted into a corresponding control signal at the fire detector information processing section 74, and sent to the central information processing section 65 through the interface 69. Then the central information processing section 65 generates a transmission signal including the remote-testing instruction in the control signal CD.

The remote annunciator 9 is connected to the main receiver 2, and receives indicating signals from the main receiver 2. The object of the remote annunciator 9 is mainly to spread the areas that share in the benefit of the fire alarm. The emergency broadcasting equipment 13 is controlled by the interlocking controller 3. When a fire breaks out, a message for inducing a refuge is automatically broadcast by the emergency broadcasting equipment 13 under the control of the interlocking controller 3.

FIG. 9 shows a circuit diagram of a main part of the main receiver 2. As shown in the figure, the main receiver 2 is provided with switching elements SW. Each switching element SW is connected to each signal transmission line 4. These switching elements SW are controlled by line selecting signals $S_1$ through $S_N$. In the figure, the switching element SW controlled by the line selecting signal $S_1$ is represented by the symbol $SW_1$; and the switching element SW controlled by the line selecting signal $S_N$ is represented by the symbol $SW_N$. Among the switching elements $SW_1$ through $SW_N$, only one of them can be closed at a time in principle. When the switching element SW is connected to a resistor Rc, the power source voltage Vcc (24V) is divided by the resistors Ra, Rb, and Rc. The resistance of the resistor Rc is considerably low, as compared with those of the resistors Ra and Rb. Therefore, when the switching element SW is connected to the resistor Rc, the line voltage Vx is approximately 24V. The resistors Ra and Rb form a voltage divider that divides the line voltage Vx. The comparator circuits CP take in the divided voltages by the resistors Ra and Rb. On the contrary, when the switching element SW is connected to the signal information converter 62, the line voltage Vx is reduced to approximately 12V at its peak.

The signal information converter 62 is composed of a signal superposing circuit 62a, a reply signal detecting circuit 62b, a current-detecting resistor 62c, and a Zener diode 62d. The signal superposing circuit 62a superposes the transmission signal Vs on the signal transmission line 4. The signal superposing circuit 62a includes a Zener diode (not shown) and a transistor (not shown) that are connected in parallel. The Zener voltage of the Zener diode in the signal superposing circuit 62a is lower than that of the Zener diode 62d. And the sum total of these Zener voltages is approximately 12V. The reply signal detecting circuit 62b detects the reply signal RS by measuring the voltage drop in the current-detecting resistor 62c. The resistance of the current-detecting resistor 62c is considerably low. Therefore, when the switching element SW is connected to the signal information converter 62, the line voltage Vx on the signal transmission line 4 is reduced to 12V at its peak. In other words, when said transistor in the signal superposing circuit 62a is closed, the line voltage Vx is reduced to the Zener voltage of the Zener diode 62d in approximation; and when said transistor in the signal superposing circuit 62a is opened, the line voltage Vx is enhanced to the sum total of said Zener voltages in approximation. Said transistor in the signal superposing circuit 62a is controlled by the transmission signal output Sa of a central processor CPU. In this embodiment, the signal information converter 62 is used in common for a plurality of signal transmission lines 4 through the multiplexer 61. So the number of the signal information converter 62 can be saved.

The reply signal detecting circuit 62b is composed of a voltage amplifier, a voltage comparator, and a voltage averaging means. Said voltage amplifier amplifies the voltage drop in the current-detecting resistor 62c. Said voltage averaging means generates an average voltage of the output voltage of said voltage amplifier. Said voltage comparator compares the output voltage of said voltage amplifier with said average voltage for detecting the reply signal RS. The detected reply signal RS enters the reply signal input Sb of the central processor CPU.

Each comparator CP takes in the divided voltage of the line voltage Vx divided by the resistors Ra and Rb. In the figure, the comparators CP connected to the signal transmission lines 4 are represented by the symbols $CP_1$ through $CP_N$. The comparator CP compares the divided voltage with predetermined voltages. The outputs of the comparators $CP_1$ through $CP_N$ enter the signal inputs $X_1$ through $X_N$ of the central processor CPU. The central processor CPU realizes the functions of the fire judging section 64 and the central information processing section 65.

The fire judging section 64 evaluates smoke density information Ds that is transmitted from the intelligent type smoke detector 5 through the signal information converter 62. The smoke density information Ds is, as mentioned above, a digital information and shows the relationship in magnitude between the detected smoke density and predetermined smoke density levels.

FIGS. 10A through 10D are explanatory diagrams illustrating the operations of the intelligent type smoke detector 5 and the fire judging section 64. In the figures, the axis of ordinates shows the detected smoke density level; the axis of abscissas shows elapsed time. In the present embodiment, the detected smoke density level is compared with three predetermined levels $L_1, L_2$, and $L_3$. The first level $L_1$ is the lowest level for making a preliminary alarm. When the detected smoke density level is higher than the level $L_1$ for over a predetermined time $T_1$, the fire judging section 64 generates a preliminary alarm signal. The preliminary alarm signal shows that the intelligent type smoke detector 5 is out of order or a real fire breaks out. The second level $L_2$ is an intermediate level for making a regular alarm. When the detected smoke density level is higher than the level $L_2$ for over a predetermined time $T_2$, the fire judging section 64 generates a regular alarm signal. The third level $L_3$ is the highest level for making the fail-safe circuit 54 operating. When the fail-safe circuit 54 operates, the level signal detecting section 63 detects the line current increase and generates a regular alarm signal.

Figure 10A:
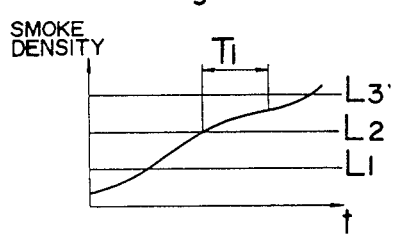
FIGS. 10A through 10D are explanatory diagrams respectively illustrating how the determination of fire presence is effectuated with the above fire alarm system.
Figure 10C:
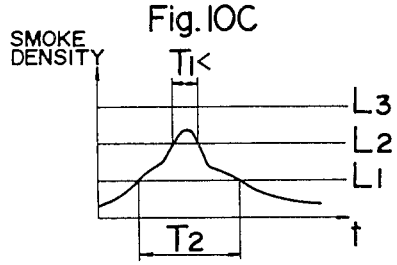
Figure 10B:
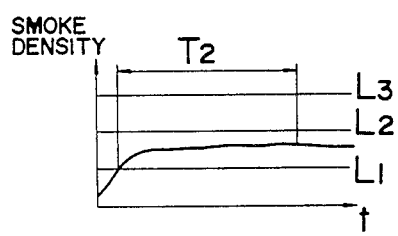
Figure 10D:
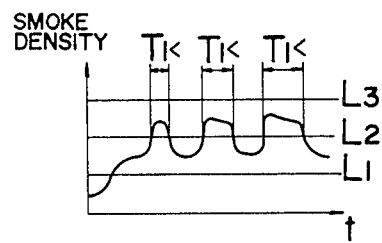

FIG. 10A shows a condition in which the regular fire alarm is generated. In this figure, the detected smoke level is higher than the level $L_2$ for over a predetermined time $T_1$. In FIG. 10B, the preliminary fire alarm is generated, because the detected smoke density is higher than the level $L_2$ for over the predetermined time $T_2$. However, in FIG. 10C, neither the regular fire alarm nor the preliminary fire alarm is generated, because the detected smoke density is higher than the level $L_2$ only for a short time interval less than the predetermined time $T_1$ and is higher than the level $L_1$ only for a short time interval less than the predetermined time $T_2$. In FIG. 10D, the preliminary fire alarm is generated on the same reason as in FIG. 10B. Besides, the regular fire alarm is also generated, if necessary, for showing that the sum total of the time intervals during each of which the detected smoke density exceeds the level $L_2$ is over a predetermined time $T_3$, even though each time when the detected smoke density exceeds the level $L_2$ is under the predetermined time $T_2$.

In order to count these predetermined times $T_1$ through $T_3$, the timer unit 64a includes three kinds of time counters Ta, Tb, and Tc. The time counter Ta starts to count the time lapse after the detected smoke density exceeds the first level $L_1$. The time counter Ta generates a time-up signal for generating the preliminary fire alarm signal by the lapse of the predetermined time $T_1$. However, when the detected smoke density decreases below the first level $L_1$ before the lapse of the predetermined time $T_1$, the time counter Ta is reset to its initial state. The second time counter Tb starts to count the time lapse after the detected smoke density exceeds the second level $L_2$. This time counter Tb generates another time-up signal for generating the regular fire alarm signal by the lapse of the predetermined time $T_2$. However, when the detected smoke density decreases below the second level $L_2$ before the lapse of the predetermined time $T_2$, the time counter Tb is reset to its initial state. The third time counter Tc starts to count the time lapse after the detected smoke density exceeds the second level $L_2$. This time counter Tc is not reset to its initial state even if the detected smoke density decreases below the second level $L_2$. And when the time intervals during each of which the detected smoke density exceeds the second level $L_2$ total more than the predetermined time $T_3$, the time counter Tc generates a time-up signal for generating the regular fire alarm signal.

The above predetermined times $T_1$ through $T_3$ can be arbitrarily prolonged or shortened for reliable detection of fire according to various situations to be supervised by the present system. For example, when one of the fire detectors detects a fire, the predetermined times $T_1$ through $T_3$ of the other fire detectors had better be shortened for increasing the sensitivity of another fire so that the spreading fire can be detected as early as possible. On the contrary, the predetermined times $T_1$ through $T_3$ had better be prolonged during the daytime. This is because the smoke of cigarettes frequently seen during the daytime could be the cause of false detection of fires. In order to discriminate the daytime from the nighttime, the central information processing section 65 is provided with an external timer 65a.

The address-sending type smoke detector 6 transmits its specific address in the form of a current pulse signal when it detects a fire. The address is received by the signal information converter 62. The central information processing section 65 takes in the output signal of the signal information converter 62. And when the address signal from the address-sending type smoke detector 6 is detected, the central information processing section 65 generates the fire alarm signal. At the same time, the information of the location of the address-sending type smoke detector 6 is sent to the fire detector information processing section 74 and is indicated by the indicating section 75a.

When the circuit-shorting type fire detector 7 detects an outbreak of a fire, the line current increases as mentioned above. The increase of the line current is detected by the level signal detecting section 63. The fire alarm signal is generated by the central information processing section 65 when the level signal detecting section 63 detects the line current increase.

When a fire is detected by the line current increase, the central information processing section 65 decreases the line voltage Vx. The decrease of the line voltage is detected by the voltage detecting circuit 42 of the circuit-shorting type fire detector 7. And the selector switching element 43 is disconnected from the resistor 44 and connected to the resistor 45 under the control of the voltage detecting circuit 42. At this occurrence, the line current decreases, as the resistance of the resistor 45 is set to be higher than that of the resistor 44. The switching element 41 is a self-hold type switching element such as a thyristor. As is well known, a self-hold type switching element is maintained in the ON state, once it is turned on. On the other hand, when the current of the switching element 41 decreases below a predetermined current level required to maintain the ON state of the switching element 41, the self-hold type switching element 41 is turned off. Therefore, in this embodiment, the resistance of the resistor 45 is so determined that the current of the switching element 41 is slightly larger than the minimum current level required to maintain the ON state of the switching element 41, allowing the current consumption of the signal transmission line 4 to be kept at minimum, even if the circuit-shorting type fire detector 7 should make the signal transmission line shorted upon detection of a fire. However, the resistance of the resistor 44 should be low enough to enable the main receiver 2 to detect without fail the line current increase caused by the closing of the switching element 41.

Incidentally, the signal transmission circuit 30 in the intelligent type smoke detector 7 transmits and receives signal only during the transmission time band A. Therefore, it is preferable to disconnect the signal transmission circuit 30 from the coupling circuit 33 during the line examining time band B and the supervisory time band C in order to increase the impedance of the intelligent type smoke detector 7 viewed from the signal transmission line 4. By disconnecting the signal transmission circuit 30 from the coupling circuit 33, the line current consumed by the intelligent type smoke detector 7 will decrease during the line examining time band B and the supervisory time band C. Therefore, even if power service should be interrupted, the fire alarm system is capable of continuing the supervision of fires with an incorporated emergency power supply of relatively small capacity.

When the preliminary fire alarm signal is generated, a preliminary alarm lamp and a preliminary alarm buzzer in the indicating section 67a are turned on under the control of the fire alarm information processing section 66. If necessary, the central information processing section 65 generates the regular fire alarm signal, when the preliminary alarm signals resulting from more than one smoke detectors 5 are generated. The fire alarm information processing section 66 turns on a regular alarm lamp and a regular alarm bell in the indicating section 67a under the control of the central information processing section 65. When a regular fire alarm signal is generated, the central information processing section 65 gives the fire alarm information processing section 66 an instruction to turn on the regular alarm lamp and the regular alarm bell. As necessary to prevent a false or premature alarm, some or all of the intelligent type smoke detectors 5 can be functionally combined into a group in such an arrangement that the fire alarm representative of true fire presence is produced only when the regular alarm signals are produced for all the detectors forming the above group. Such group can be designated at the input section 75b by the operator and the functional relation among the detectors 5 is memorized in the fire detector information processing section 74.

The regular alarm bell can be also manually controlled in the input section 67b. When the fire location is detected, the location is indicated in the indicating section 75a under the control of the detector information processing section 74.

The central information processing section 65 examines whether the signal transmission line 4 is interrupted or not in the line examining time band B. In this time band B, the impedance of the terminating device 8 is reduced to increase the line current. The central information processing section 65 detects the line current increase by the level signal detecting section 63. When the signal transmission line 4 is interrupted somewhere, the line current will not increase a bit, as compared with the supervisory time band C in which the impedance of the terminating device 8 is not reduced. Therefore the central information processing section 65 can decide whether the signal transmission line 4 is interrupted or not by comparing the line current in the time band B with that in the time band C. Besides, if the line current goes extremely higher than the normally expected value, the central information processing section 65 can detect that the signal transmission line 4 is shorted somewhere. Thus the interruption and the short of the signal transmission line 4 can be detected in the line examining time band B.

The line current increase in the line examining time band B can be also used for examining the operation of the fire alarm information processing section 66. When an instruction demanding such examination is input to the fire alarm information processing section 66 in the input section 67b, the fire alarm information processing section 66 regards the line current increase caused by the impedance decrease in the terminating device 8 as that caused by the impedance decrease in the fire detectors, and generates the regular fire alarm signal. Thus the examination of the fire alarm information processing section 66 can be fulfilled without requiring the detectors to be operated.

By the way, as is closely mentioned above, the selector switching elements $SW_1$ through $SW_N$ are controlled by the output signals $S_1$ through $S_N$ of the central processor CPU, and only one of the switching elements SW can be closed at a time in principle. However, in a specially allocated time band D shown in FIG. 2, all the selector switching elements SW are turned on simultaneously at a time. During this time band D, the line voltages $V_{X1}$ through $V_{XN}$ are reduced to 12V, and when the time band D is terminated, all the line voltages $V_{X1}$ through $V_{XN}$ increase to their normal voltages (24V). Therefore, each terminating device 8 of the signal transmission line 4 detects the line voltage increase, which results in the decrease in the impedance of each terminating device 8. Accordingly, in this case, the line examination can be fulfilled in quite a short period.

Figure 14:
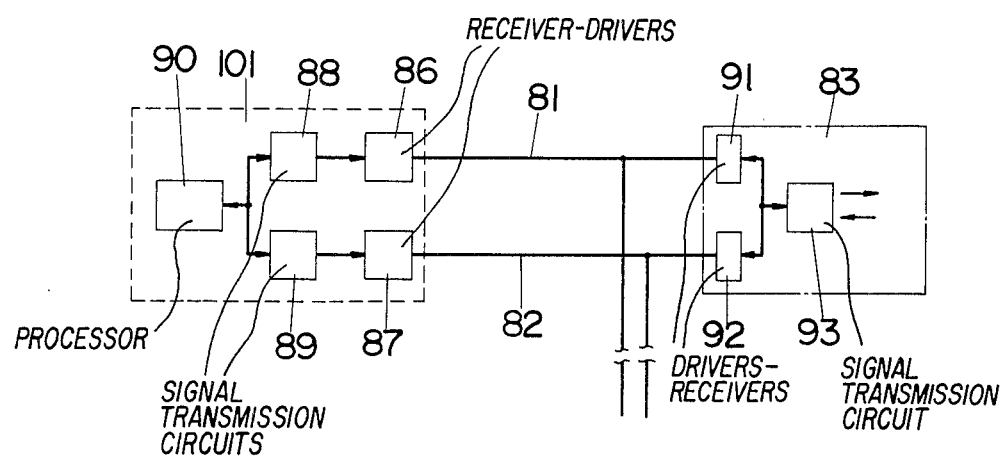
FIG. 14 is a block diagram showing a part of the above fire alarm system.
Figure 15:
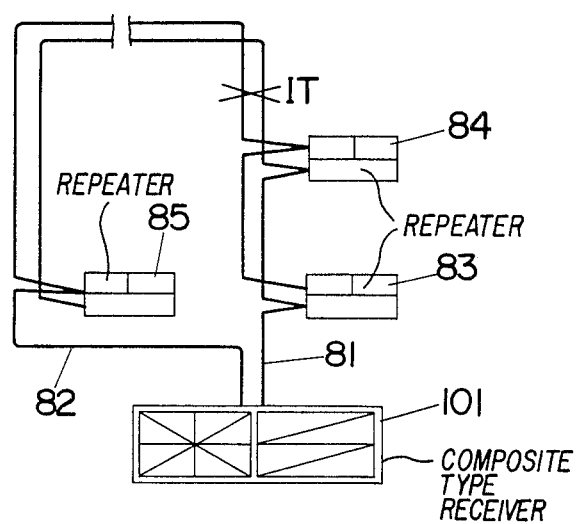
FIG. 15 is a block diagram showing a fire alarm system in accordance with one modification of the second embodiment.

The second embodiment of the present invention shown in FIGS. 13 through 15 is substantially similar in construction to the first embodiment except that a couple of signal transmission lines 81 and 82 are used to connect a composite type receiver 101 with repeater devices 83, 84 and 85. The same reference numerals as used in the preceding figures are employed to indicate the corresponding parts to avoid the necessity for repeating the relevant explanation. The repeater device 83 is an intelligent type repeater device that has substantially similar function as the composite type receiver 1 in the first embodiment. In the figure, the intelligent type repeater device 83 is connected to signal transmission lines 4 for connecting detectors, another signal transmission line 16 for connecting alarm devices, and a control line 10 for connecting fire-proof and smoke-proof devices. An intelligent type smoke detector 5, an address-sending type smoke detector 6 and a circuit-shorting type fire detector 7 are connected to the signal transmission line 4. A terminating device 8 is connected to the terminal ends of the signal transmission line 4. Alarm bells 15 are connected to the signal transmission line 16. A fire-proof door locking device 11, a smoke ejector 12, and a fire-proof damper 14 are connected to the control line 10. When the intelligent type repeater device 83 detects an outbreak of a fire, the information is sent as far as the composite type receiver 101 through signal transmission lines 81 and 82 in the form of the reply signal RS. The repeater device 84 is a supervisory control type repeater device. Control lines 10 are connected to the supervisory control type repeater device 84. In the figure, a fire-proof door locking device 11 and smoke ejectors 12 are connected to each one of the control lines 10. The repeater device 85 is a standard type repeater device. Signal transmission lines 17 are connected to the standard type repeater device 85. Circuit-shorting type fire detectors 8 are connected to each one of the signal transmission lines 17. A terminating device 18 is connected to the terminal ends of the signal transmission line 17.

A couple of signal transmission lines 81 and 82 are connected in such a way as shown in FIG. 14 to the composite type receiver 101 and the repeater devices 83 through 85. In the figure, the intelligent type repeater device 83 is shown as representing the repeater device. On the signal transmission lines 81 and 82, the level signal as mentioned above is not transmitted, but a transmission signal Vs that is similar to that of the first embodiment is transmitted. The transmission signal Vs is composed of a start signal ST, an address signal AD, a control signal CD, and a long duration pulse signal RT. The start signal ST shows the starting timing of the transmission signal. The address signal AD selects one repeater device out of the repeater devices 83, 84 and 85. The control signal CD includes control information from the composite type receiver 101 to the repeater device selected by the address signal AD. The long duration pulse signal RT indicates the time band when the repeater device selected by the address signal AD transmits a reply signal RS in the form of a current pulse signal. The start signal ST, the address signal AD, the control signal CD, and the long duration pulse signal RT are arranged in a series time band. These pulses are sent in the form of voltage pulse signals. The composite type receiver 101 is provided with a couple of driver-receivers 86 and 87. These driver-receivers 86 and 87 are connected to the signal transmission circuits 88 and 89. These signal transmission circuits 88 and 89 are connected to an information processor 90. If necessary, only one of the signal transmission circuits 88 and 89 may be connected in common to the receiver-drivers 86 and 87; and the other can be omitted. Further, one of the signal transmission circuits 88 and 89 may be disconnected from the information processor 90 and connected to another information processor that is equivalent to the information processor 90. In the intelligent type repeater device 83, driver-receivers 91 and 92 are connected to the signal transmission lines 81 and 82. A signal transmission circuit 93 is connected to the driver-receivers 91 and 92. The signal transmission circuit 93 receives a logical sum (OR) of the received signals of the driver-receivers 91 and 92. This holds true in the connecting relationship between the information processor 90 and the signal transmission circuits 88 and 89. Namely, the information processor 90 receives a logical sum (OR) of the received reply signals RS. Therefore, in the present embodiment, the reliability of the signal transmission between the composite type receiver 101 and the repeater devices 83, 84 and 85 is much improved. That is, even if one of the signal transmission lines 81 and 82 is interrupted, the signal transmission function will not be impaired at all. Besides, it is preferable to check the signal on the signal transmission line 81 with that on the signal transmission line 82 instead of merely getting a logical sum (OR) of the signals on the signal transmission lines 81 and 82 as mentioned above.

A couple of signal transmission lines 81 and 82 can be also used in the following ways. One way is to use one of the signal transmission lines 81 and 82 for transmitting a signal from the composite type receiver 101 to the repeater devices 83, 84, and 85; and the other for transmitting a signal from the repeater devices 83, 84 and 85 to the composite type receiver 101. Still another way of using the signal transmission lines 81 and 82 is to use only one of the signal transmission lines 81 and 82 for transmitting a signal and reserve the other for an emergency purpose.

In this embodiment, a couple of signal transmission lines 81 and 82 are used only between the composite type receiver 101 and the repeater devices 83, 84 and 85. However, it may be possible to employ the combination of signal transmission lines instead of each signal transmission line composed of two wires in order to improve the reliability of the signal transmission.

FIG. 15 shows a schematic block diagram of one modification of the second embodiment, in which two signal transmission lines forming one composite cable are introduced for safe connection of the composite type receiver with three repeater devices 83, 84 and 85. These repeater devices 83, 84 and 85 are carried in this order on the one of the signal transmission line beginning with the composite type receiver 101 and terminating in the repeater device 85, while they are carried in the reverse order on the other signal transmission line 82 beginning with the composite type receiver 101 and terminating in the repeater device 83. With this arrangement, the signal can be successfully transmitted between the composite type receiver 101 and the respective ones of the repeater devices 83, 84 and 85, even if the interruption should occur at any point of said cable, for example, at point IT of the figure.

Although the present invention has been described in its preferred embodiments, it should be understood by those skilled in the art that the present invention is not limited to the present embodiments and various changes and modifications may be made without departing the spirit and scope of the present invention.

What is claimed is:

1. A signal transmission system comprising:
   a central unit in combination with first and second terminal means connected thereto through a common signal transmission line comprising two wires;
   said first terminal means transmitting to the central unit a first signal in the form of a level signal; and
   said second terminal means transmitting and receiving a second signal in the form of a superposed signal upon the first signal to and from said central unit, said central unit including a time division multiplex device which determines:
   a level signal transmission time band in which the central unit receives the level signal on the signal transmission line; and
   a superposed signal transmission time band in which the central unit transmits and recieves the superposed signal on the signal transmission line, said superposed signal transmission time band alternating with said level signal transmission time band.

2. A signal transmission system as set forth in claim 1, further comprising a plurality of sets of said first and second terminal means and wherein:
   said central unit is connected to the sets of terminal means through individual said signal transmission lines; and
   said time division multiplex device is arranged to distribute the superposed signal transmission time bands on the signal transmission lines in such a manner that the superposed signal transmission time band on one signal transmission line does not occur concurrently with those on any one of the other signal transmission lines.

3. A signal transmission system, comprising:
   a central unit in combination with first and second terminal means connected thereto through a common signal transmission line comprising two wires;
   said first terminal means transmitting to the central unit a first signal in the form of a level signal; and
   said second terminal means transmitting and receiving a second signal in the form of a superposed signal upon the first signal to and from said central unit;
   said central unit being connected to a master receiver through a main line to which a plurality of repeater devices are connected;
   said repeater devices and the second terminal means having specific addresses for communication with the master receiver;
   said master receiver sending an address signal for selecting one of said repeater devices or the second terminal means;
   said master receiver sending a control signal accompanying said address signal; and
   said master receiver receiving a reply signal in accordance with said control signal from one of said repeater devices or the second terminal means selected by the address signal.

4. A signal transmission system as set forth in claim 3 wherein:
   said central unit and said repeater devices are connected to said master receiver by way of a second main line;
   the same signal as is transmitted on the first main line being transmitted on the second main line.

5. A signal transmission system as set forth in claim 4 wherein said repeater devices and said central unit are disposed on the second main line in the reverse order to the order in which said repeater devices and said central unit are disposed on said first main line.

6. A signal transmission system, comprising:
   a central unit in combination with first and second terminal means connected thereto through a common signal transmission line comprising two wires;
   said first terminal means transmitting to the central unit a first signal in the form of a level signal; and said second terminal means transmitting and receiving a second signal in the form of a superposed signal upon the first signal to and from said central unit, the first terminal means comprising:
a self-hold type switching element which is turned on when an abnormal state such as fire presence is detected;
a current-limiting element which is connected in series with the switching element between the two wires of the signal transmission line; and
means for increasing the impedance of said current-limiting element up to such a value as to limit a current in said switching element to a minimum required for maintaining the ON state of said switching element when the line current increase caused by the closing of the switching element is detected by the central unit.

7. A signal transmission system, comprising;
a central unit in combination with first and second terminal means connected thereto through a common signal transmission line comprising two wires;
said first terminal means transmitting to the central unit a first signal in the form of a level signal; and
said second terminal means transmitting and receiving a second signal in the form of a superposed signal upon the first signal to and from said central unit, the second terminal means comprising an intelligent type smoke detector comprising:
smoke detecting means to detect a smoke density,
transmission means to transmit to the central unit the second signal including the information of the detected smoke density,
switching means which is closed when the detected smoke density is higher than a predetermined density, and
current-limiting means that is connected in series with the switching means between the two wires of the signal transmission line and transmits to the central unit the first signal in the form of a current level when the switching means is closed.

8. A signal transmission system comprising:
a central unit in combination with first and second terminal means connected thereto through a common signal transmission line comprising two wires;
said first terminal means transmitting to the central unit a first signal in the form of a level signal during a level signal transmission time band;
said second terminal means transmitting and receiving a second signal in the form of a superposed signal upon the first signal to and from said central unit during a superposed signal transmission time band, said superposed signal transmission time band alternating with the level signal transmission time band; and
said central unit including voltage control means to apply to the signal transmission line a first voltage during the level signal transmission time band and a second voltage that is lower than the first voltage during the superposed signal transmission time band.

9. A signal transmission system as set forth in claim 8, further comprising a plurality of sets of said terminal means and wherein:
said central unit is connected to the sets of terminal means through individual said signal transmission lines; and
the central unit is arranged to distribute the superposed signal transmission time bands on the signal transmission lines in such a manner that the superposed signal transmission time band on one signal transmission line does not occur concurrently with those on any one of the other signal transmission lines.

10. A signal transmission system as set forth in claim 8 wherein:
the signal transmission line is provided at its terminal end with a terminal device connected between the wires thereof;
the terminating device responding to a trigger signal carried on the signal transmission line for increasing the current flowing therethrough for a preselected time interval such that said central unit connected to the signal transmission line can acknowledge the resulting current increase in the signal transmission line only when the signal transmission line is not interrupted,
whereby the central unit can determine whether or not the signal transmission line is interrupted.

11. A signal transmission system as set forth in claim 10 wherein said central unit includes a comparator which:
compares the current level on said signal transmission line with a predetermined current level during said preselected time interval to determine whether or not the signal transmission line is interrupted;
and compares the current level on said signal transmission line with a predetermined current level during said level signal transmission time band excluding said preselected time interval to supervise said level signal.

12. A signal transmission system as set forth in claim 10, including means for checking whether or not the central unit is normal, said means comprising pilot means which provides indication when the central unit responds properly to said current increase in the signal transmission line due to the operation of said terminating device.

* * * * *